(12) United States Patent
Murayama et al.

(10) Patent No.: US 7,705,451 B2
(45) Date of Patent: Apr. 27, 2010

(54) SEMICONDUCTOR DEVICE AND METHOD OF MANUFACTURING THE SAME

(75) Inventors: Kei Murayama, Nagano (JP); Yuichi Taguchi, Nagano (JP); Naoyuki Koizumi, Nagano (JP); Masahiro Sunohara, Nagano (JP); Akinori Shiraishi, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 94 days.

(21) Appl. No.: 11/882,568

(22) Filed: Aug. 2, 2007

(65) Prior Publication Data

US 2008/0029852 A1    Feb. 7, 2008

(30) Foreign Application Priority Data

Aug. 3, 2006    (JP)    ............... P.2006-212491

(51) Int. Cl.
*H01L 23/06*    (2006.01)
(52) U.S. Cl. .............. 257/729; 257/621; 257/684; 257/700

(58) Field of Classification Search ............... 257/621, 257/684, 700, 729
See application file for complete search history.

(56) References Cited

U.S. PATENT DOCUMENTS

| 5,858,816 | A  | * | 1/1999 | Sato et al. ............... 438/125 |
| 5,883,428 | A  | * | 3/1999 | Kabumoto et al. ......... 257/691 |
| 6,528,875 | B1 | * | 3/2003 | Glenn et al. ............. 257/704 |
| 7,061,102 | B2 | * | 6/2006 | Eghan et al. ............. 257/713 |

FOREIGN PATENT DOCUMENTS

JP    2000-39371    2/2000

* cited by examiner

*Primary Examiner*—Douglas M Menz
(74) *Attorney, Agent, or Firm*—Drinker Biddle & Reath LLP

(57) ABSTRACT

A semiconductor device includes a laminated substrate formed by laminating a plurality of semiconductor substrates, a concave part formed in the laminated substrate, and a semiconductor element mounted in the concave part. A method of manufacturing a semiconductor device includes a first step of forming a laminated substrate by laminating a plurality of semiconductor substrates, a second step of forming a concave part by etching the laminated substrate, and a third step of mounting a semiconductor element in the concave part.

9 Claims, 8 Drawing Sheets

SEMICONDUCTOR DEVICE AND METHOD OF MANUFACTURING THE SAME

BACKGROUND OF THE INVENTION

The present invention relates to a semiconductor device in which a semiconductor element is mounted in a substrate and a method of manufacturing the semiconductor device.

A structure of mounting a semiconductor element has been variously proposed. For example, a structure in which a predefined semiconductor element is mounted in a concave part (or cavity) formed in a substrate has been proposed.

For example, if an MEMS (Micro Electro Mechanical System) element serving as a kind of semiconductor element is mounted, it is advantageous that package miniaturization or microfabrication is possible and also the element is easily sealed when the element is mounted in the concave part.

Further, a substrate for mounting a semiconductor element is developing from a conventional ceramic substrate to a semiconductor (for example, silicon) substrate in which miniaturization or microfabrication is facilitated.

[Patent Document 1]

Unexamined Japanese Patent Application Publication No. 2000-39371

However, a silicon wafer capable of being conventionally easily obtained as a current semiconductor substrate has the thickness of about 600 μm to 800 μm, and has a problem in that it is difficult to increase the depth of a concave part for mounting a semiconductor element. For example, if a special substrate thicker than the semiconductor substrate capable of being conventionally obtained is made, the concave part can be deeply formed, but the cost of manufacturing the semiconductor substrate increases. This is not realistic when the productivity upon production is considered.

Further, if the concave part is deeply formed, there is a problem in that the variation in a form (particularly, flatness) of the concave part is increased and the yield (or productivity) of a semiconductor device to be formed is degraded.

Further, a method disclosed in Patent Document 1 (Japanese Unexamined Patent Application Publication No. 2000-39371) forms a cavity by laminating semiconductor substrates, but the cavity is used to form a pressure detection element (or diaphragm). A method and structure for mounting a semiconductor element in the cavity are not disclosed in detail.

SUMMARY OF THE INVENTION

Therefore, a general object of the invention that has been made to address the above problems is to newly provide a useful semiconductor device and a method of manufacturing the semiconductor device.

A more specific object of the invention is to provide a semiconductor device in which the productivity is better and a semiconductor element is mounted in a substrate and a method of manufacturing the semiconductor device.

In order to address the above problems, according to a first aspect of the invention, there is provided a semiconductor device, including:

a laminated substrate formed by laminating a plurality of semiconductor substrates, the laminated substrate being provided with a concave part formed therein, and a semiconductor element mounted in the concave part.

The invention may provide a semiconductor device in which the productivity is better and a semiconductor element is mounted in a substrate.

When the plurality of semiconductor substrates are made of silicon substrates, with being laminated by a junction layer of a silicon oxide film, a structure of the laminated substrate is stable.

Moreover, it may be that a via plug passing through the laminated substrate is formed in a lower surface of the concave part, and the semiconductor element is mounted to be connected to the via plug.

When the concave part is formed to pass through at least one of the plurality of semiconductor substrates, the concave part may be deeply formed.

When the concave part is a structure in which holes respectively formed in the plurality of semiconductor substrates communicate, the concave part may be deeply formed.

When the plurality of semiconductor substrates are laminated in which crystal orientations of the plurality of substrates are different to construct the laminated substrate, the degree of freedom of mounting of the semiconductor element to be mounted is improved.

In order to address the above problems, according to a second aspect of the invention, there is provided a method of manufacturing a semiconductor device, including:

a first step of forming a laminated substrate by laminating a plurality of semiconductor substrates, a second step of forming a concave part by etching the laminated substrate, and a third step of mounting a semiconductor element in the concave part.

In accordance with the invention, the semiconductor device in which the semiconductor element is mounted in the substrate can be manufactured with a better productivity.

When a junction layer is used to laminate the plurality of semiconductor substrates in the first step, and the junction layer is used as an etching stopper layer in the second step, the concave part is easily formed.

When the plurality of semiconductor substrates are made of silicon substrates, and the junction layer is a silicon oxide film, the laminated substrate may be easily formed.

When the plurality of semiconductor substrates are laminated in which crystal orientations of the plurality of substrates are different in the first step, the degree of freedom of mounting of the semiconductor element to be mounted is improved.

The invention can provide a semiconductor device in which the productivity is better and a semiconductor element is mounted in a substrate and a method of manufacturing the semiconductor device.

DETAILED DESCRIPTION OF THE PREFERRED EMBODIMENTS

In accordance with the invention, a semiconductor device includes a laminated substrate formed by laminating a plurality of semiconductor substrates, a concave part formed in the laminated substrate, and a semiconductor element mounted in the concave part.

When a semiconductor element is conventionally mounted in a concave part (or cavity) of a semiconductor substrate, the depth of the concave part for receiving the semiconductor element is limited by the thickness of the semiconductor substrate. Further, when the concave part is deeply formed, a special semiconductor substrate is to be manufactured at high costs.

As a result, a semiconductor device in accordance with the invention is characterized in that a concave part for mounting a semiconductor element is formed using a laminated substrate in which a plurality of semiconductor substrates are laminated. Therefore, a substrate for mounting of a semiconductor element in which a concave part deeper than a conventional concave part is formed can be easily constructed with a generally cheap semiconductor substrate (for example, a silicon wafer or the like). As a result, a semiconductor device in which a semiconductor element is mounted in a concave part with a better productivity can be constructed.

When the semiconductor device is manufactured, a depth in which etching is possible is more than that of a conventional semiconductor substrate and a margin of an etching amount is large such that etching is performed to form a concave part in a laminated substrate.

Further, when the concave part is formed by etching the laminated substrate, a junction surface can be used as an etching stopper layer. Therefore, the concave part can be easily formed and also the processing accuracy can be better. For example, when a silicon substrate is used as the semiconductor substrate, it is desirable to form a film including a silicon oxide film serving as a junction layer to a junction surface of the semiconductor substrate. The junction layer can be used to laminate silicon substrates and can be used as an etching stopper layer when the concave part is formed.

Next, an example of a method of manufacturing the semiconductor device and an example of a structure of the semiconductor device to be manufactured will be described with reference to the drawings.

Embodiment 1

Figure 1A:
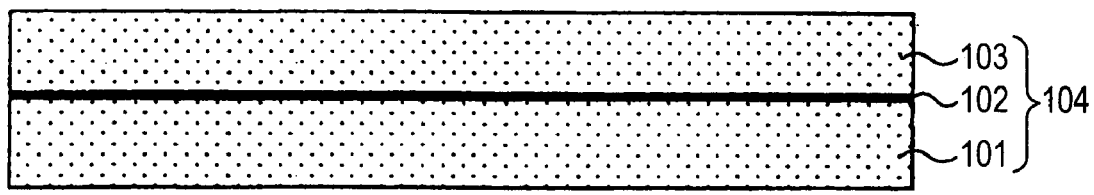
FIG. 1A is a (first) view illustrating a method of manufacturing a semiconductor device in accordance with Embodiment 1.
Figure 1B:
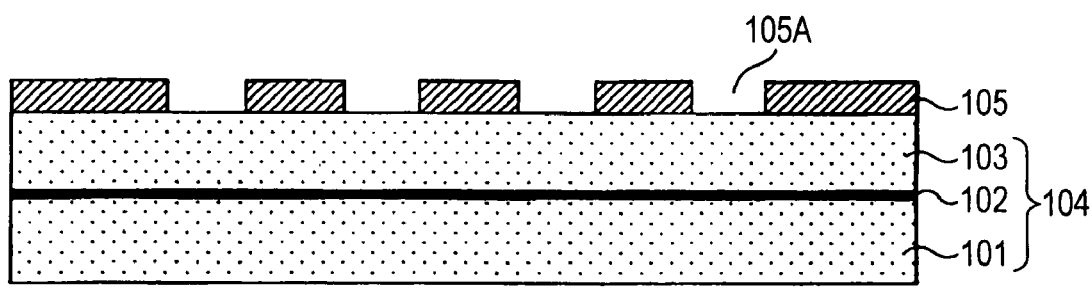
FIG. 1B is a (second) view illustrating the method of manufacturing a semiconductor device in accordance with Embodiment 1.
Figure 1C:
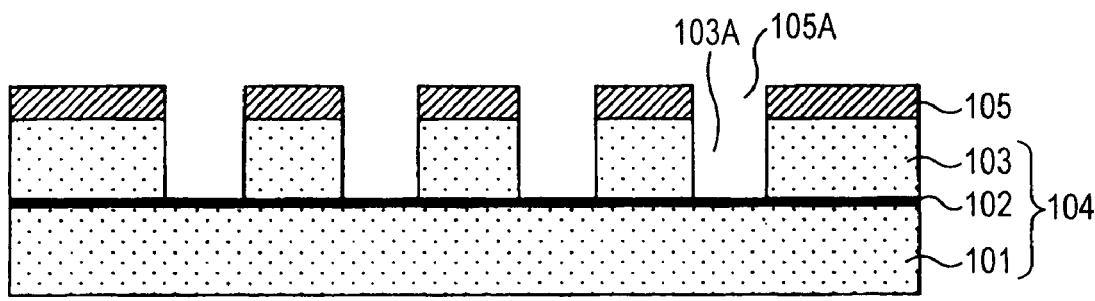
FIG. 1C is a (third) view illustrating the method of manufacturing a semiconductor device in accordance with Embodiment 1.
Figure 1D:
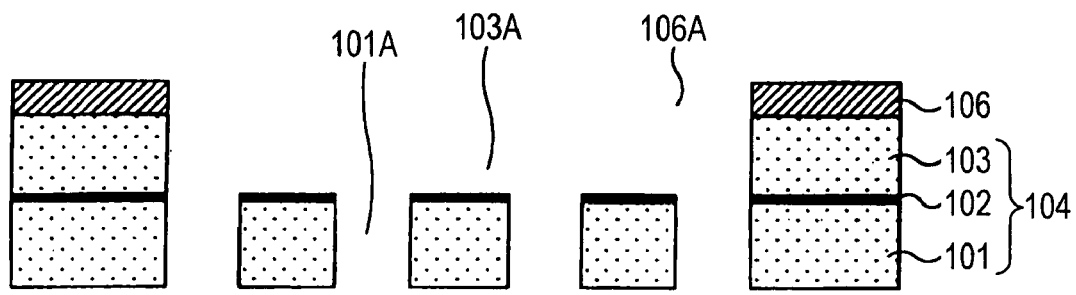
FIG. 1D is a (fourth) view illustrating the method of manufacturing a semiconductor device in accordance with Embodiment 1.
Figure 1E:
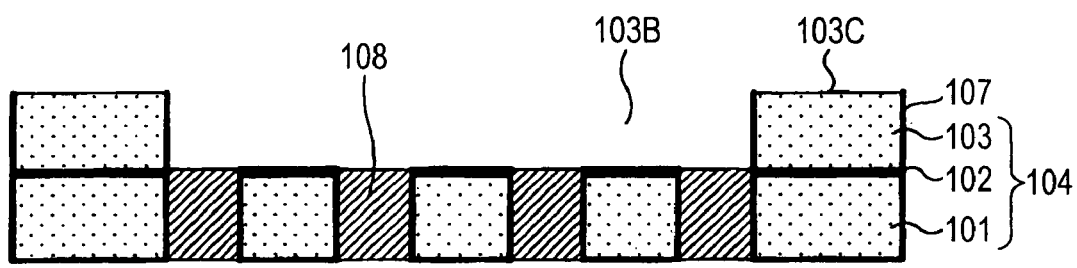
FIG. 1E is a (fifth) view illustrating the method of manufacturing a semiconductor device in accordance with Embodiment 1.
Figure 1F:
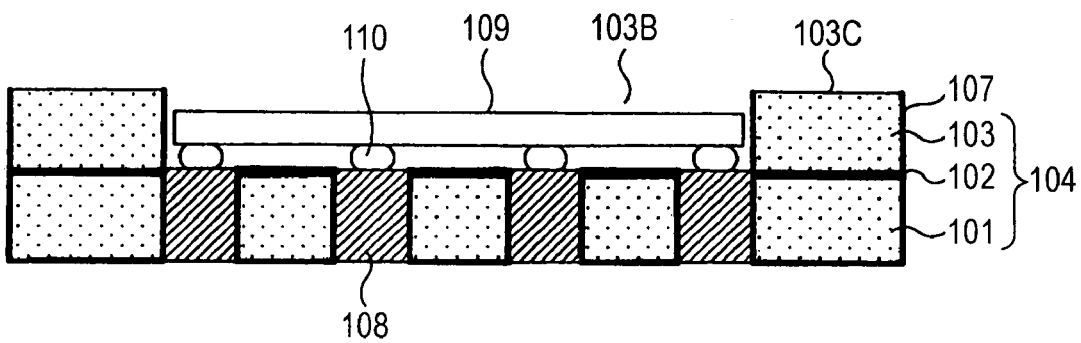
FIG. 1F is a (sixth) view illustrating the method of manufacturing a semiconductor device in accordance with Embodiment 1.
Figure 1G:
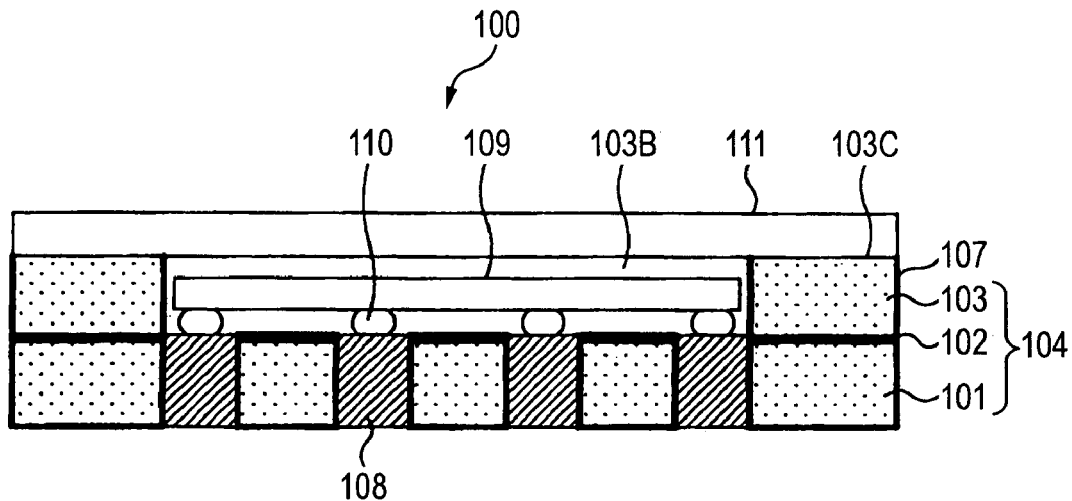
FIG. 1G is a (seventh) view illustrating the method of manufacturing a semiconductor device in accordance with Embodiment 1.

FIGS. 1A to 1G illustrate a method of manufacturing a semiconductor device in a procedure in accordance with Embodiment 1 of the invention, and FIG. 1G also illustrates a structure of the semiconductor device in accordance with Embodiment 1 of the invention. Only, the same parts as previously described are indicated by the same reference numerals in the following drawings and a description is omitted.

First, in a process as illustrated in FIG. 1A, for example, a first semiconductor substrate 101 made of a silicon substrate (or silicon wafer) and a second semiconductor substrate 103 made of a silicon substrate (or silicon wafer) are laminated (or joined), such that a laminated substrate is formed. This substrate is referred to as an SOI substrate.

Further, when a silicon wafer (of the thickness of 600 μm to 800 μm) is used as the first semiconductor substrate 101 or the second semiconductor substrate 103, the silicon wafer can be thinned by polishing in advance the silicon wafer. In this embodiment, for example, the silicon wafer is used as the first semiconductor substrate 101 by polishing the silicon wafer to the thickness of 200 μm to 300 μm, and the second semiconductor substrate 103 is used (in the thickness of 600 μm to 800 μm) as it is, without polishing the silicon wafer.

A predefined junction layer 102 can be formed between the first semiconductor substrate 101 and the second semiconductor substrate 103 (or to the junction surface) to easily join the substrates. In this embodiment, the first semiconductor substrate 101 and the second semiconductor substrate 103 are easily laminated by forming, for example, the junction layer 102 made of a silicon oxide film on the first semiconductor substrate 101. For example, the first semiconductor substrate 101 and the second semiconductor substrate 103 can be stably laminated by means of the junction layer 102 by mounting the second semiconductor substrate 103 on the junction layer 102 formed on the first substrate 101 and applying heat at a temperature of about 1100° C.

Further, the junction layer 102 can be used as an etching stopper layer of the laminated substrate 104 when a concave part is formed (as described below).

Next, in a process as illustrated in FIG. 1B, a resist pattern 105 having an opening 105A is formed on the laminated substrate 104 (or the second semiconductor substrate 103), for example, using a patterning method based on a photolithography method.

Next, in a process as illustrated in FIG. 1C, for example, a pattern etching of the second semiconductor substrate 103 is performed with the resist pattern 105 serving as a mask through a dry etching such as, for example, RIE (Reactive Ion Etching) using plasma, and a hole 103A is formed in the second semiconductor substrate 103. Further, the pattern etching as described above can be performed through a wet etching.

Since the junction layer 102 having a constitution different from that of the second semiconductor substrate 103 functions as an etching stopper layer in etching as described above, etching is stopped at a point of time when the junction layer 102 is exposed.

Next, in a process as illustrated in FIG. 1D, the junction layer 102 exposed at a lower part of the hole 103A is etched and removed by changing a type of gas to be used in the dry etching (or changing etching liquid to be used in the wet etching). In addition, a pattern etching of the second semiconductor substrate 103 is performed with the resist pattern 105 of FIG. 1C serving as the mask through the dry etching as in the case as illustrated in FIG. 1C and a hole (or via hole) 101A passing through the first semiconductor substrate 101 is formed. Further, the pattern etching can be performed through the wet etching.

After removing the resist pattern 105, a resist pattern 106 having an opening 106A is formed on the newly laminated substrate 104 (or the second semiconductor substrate 103). Next, the pattern etching of the second semiconductor substrate 103 is performed with the resist pattern 106 serving as the mask through the dry etching and a concave part (or hole) 103B passing through the second semiconductor substrate 103 is formed in which the semiconductor element is mounted. Further, the pattern etching can be performed through the wet etching.

Since the junction layer 102 having a constitution different from that of the second semiconductor substrate 103 functions as an etching stopper layer in etching as described above, etching is stopped at a point of time when the junction layer 102 is exposed. That is, the concave part 103B can be easily formed which has the depth almost equal to the thickness of the second semiconductor substrate 103.

Next, in a process as illustrated in FIG. 1E, an insulating film (for example, a thermal oxide film) 107 is formed on a surface of the laminated substrate 104 (or the first semiconductor substrate 101 and the second semiconductor substrate 103). Further, it is desirable to exfoliate an insulating film of a junction surface 103C with which a cover for sealing the semiconductor element is joined in a subsequent process.

Next, a via plug 108 made of a conductivity material (for example, Cu) is formed in the via hole 101A by, for example, a plating method.

Next, in a process as illustrated in FIG. 1F, the semiconductor element 109 on which a bump 110 is formed is mounted in the concave part 103B. In this case, the semiconductor element 109 is flip-chip connected and mounted in the via plug 108 formed to pass through the laminated substrate 104 (or the first semiconductor substrate 101) at a lower part of the concave part 103B.

In addition, according to a specification of the semiconductor element 109 to be mounted, the semiconductor element 109 can be sealed (or closed) in the concave part 103B by performing the next process as illustrated in FIG. 1G. For example, an MEMS (Micro Electro Mechanical System) element serves as a kind of semiconductor element. Various MEMS elements can be sealed and used in a predefined closed space. In this case, the semiconductor element 109 can be sealed as follows.

For example, in the process as illustrated in FIG. 1G, a flat-shaped cover 111 is installed on the concave part 103B to seal the semiconductor element 109. In this case, the cover 111 is joined with the laminated substrate 104 (or the second semiconductor substrate 103) Further, when the cover 111 is made of glass, the cover 111 can be joined with the second semiconductor substrate 103 made of silicon through an anodic bonding process. Therefore, the concave part 103B is of the closed space and the semiconductor element 109 is sealed in the closed space.

Therefore, a semiconductor device 100 in which the semiconductor element 109 is mounted in the concave part 103B of the laminated part 104 can be manufactured.

The method of manufacturing a semiconductor device is characterized in that it is easy to deeply form the concave part 103B for mounting the semiconductor element 109. For example, since the concave part 103B is formed to pass through the second semiconductor substrate 103, the depth of the concave part 103B can be formed which is almost equal to the thickness (of 600 µm to 800 µm) of the second semiconductor substrate 103.

Further, since the junction layer 102 for joining the semiconductor substrates functions as the etching stopper layer in the case where the concave part 103B is formed through etching, the etching depth of the concave part 103B can be easily controlled.

For example, in this embodiment, a plurality of semiconductor devices 100 are manufactured by forming a plurality of concave parts 103B to the laminated substrate 104, mounting semiconductor elements therein, and partitioning the laminated substrate 104 (or cutting the laminated substrate 104) in a subsequent process. Also in this case, the depth variation in a plurality of concave parts 103 can be suppressed by forming the concave parts 103B through etching using the etching stopper layer (or the junction layer 102).

Further, when a concave part for mounting a semiconductor element is formed, the deeper concave part can be formed by respectively forming holes in a plurality of semiconductor substrates to be laminated and enabling the holes to communicate. That is, when the concave part is formed through etching, the next semiconductor substrate exposed after the concave part passes through the first semiconductor substrate can be additionally etched, and these processes are repeated, if necessary, to form the concave part for mounting the semiconductor element.

Further, when the deep concave part is formed as described above, a structure suitable to mount a plurality of semiconductor elements (for example, a laminated semiconductor element) is constructed. Next, an example of a method of manufacturing the semiconductor device will be described.

Embodiment 2

Figure 2A:
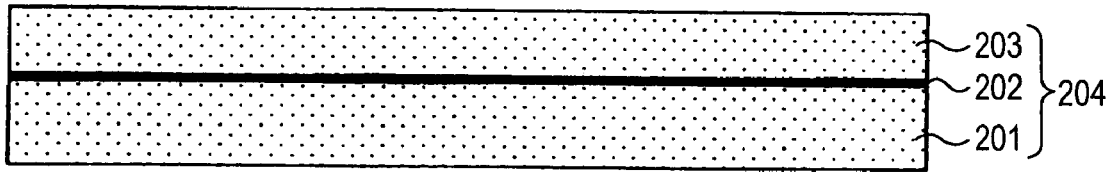
FIG. 2A is a (first) view illustrating a method of manufacturing a semiconductor device in accordance with Embodiment 2.
Figure 2B:
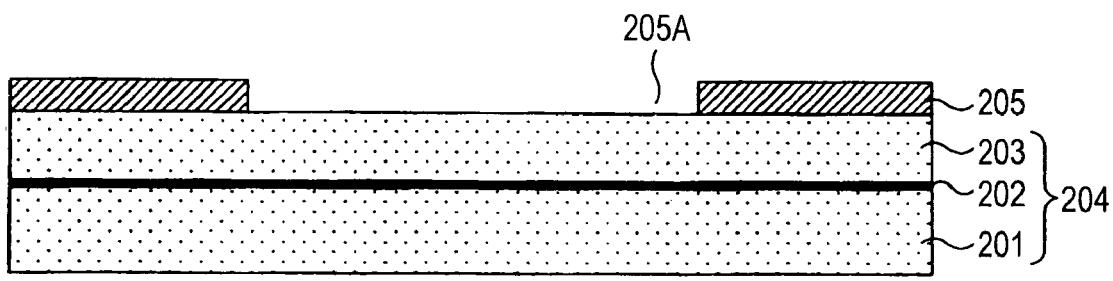
FIG. 2B is a (second) view illustrating the method of manufacturing a semiconductor device in accordance with Embodiment 2.
Figure 2C:
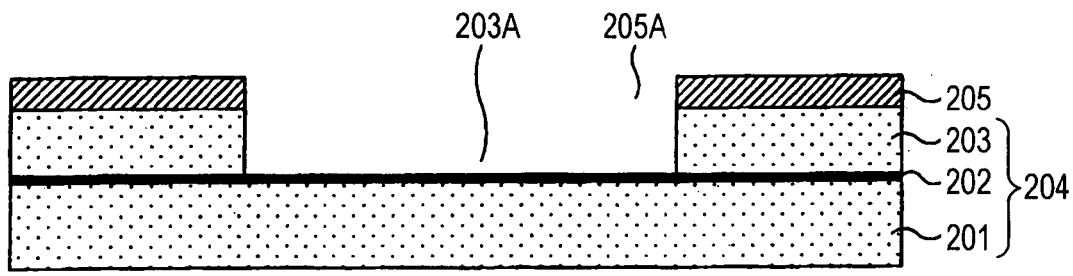
FIG. 2C is a (third) view illustrating the method of manufacturing a semiconductor device in accordance with Embodiment 2.
Figure 2D:
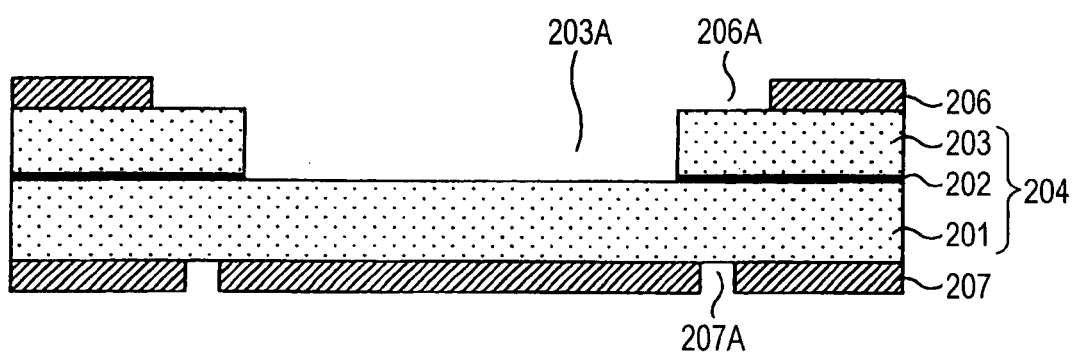
FIG. 2D is a (fourth) view illustrating the method of manufacturing a semiconductor device in accordance with Embodiment 2.
Figure 2E:
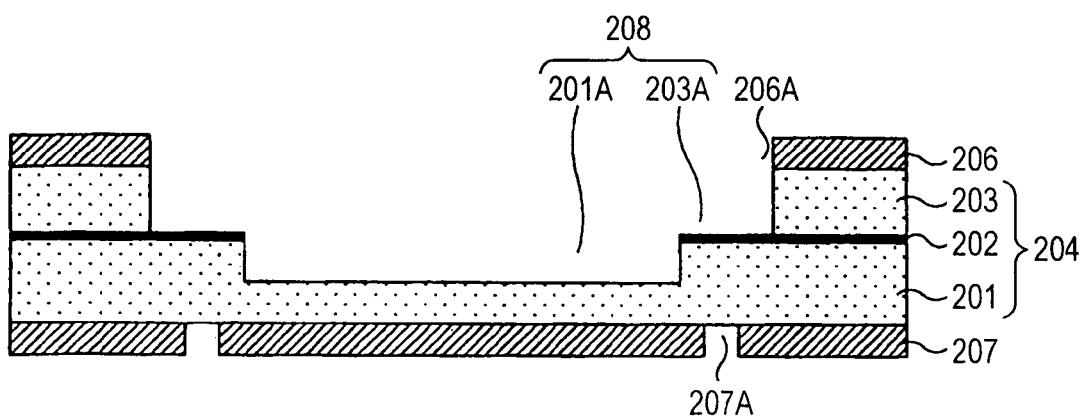
FIG. 2E is a (fifth) view illustrating the method of manufacturing a semiconductor device in accordance with Embodiment 2.
Figure 2F:
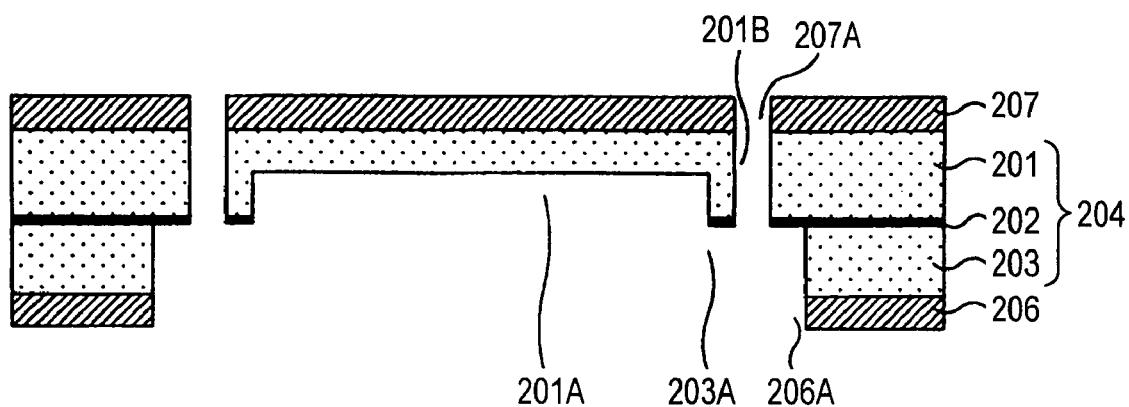
FIG. 2F is a (sixth) view illustrating the method of manufacturing a semiconductor device in accordance with Embodiment 2.
Figure 2G:
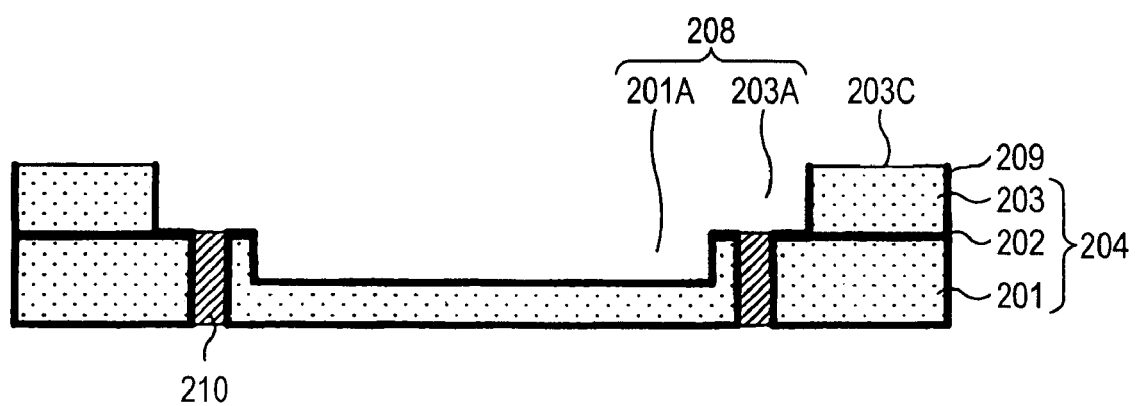
FIG. 2G is a (seventh) view illustrating the method of manufacturing a semiconductor device in accordance with Embodiment 2.
Figure 2H:
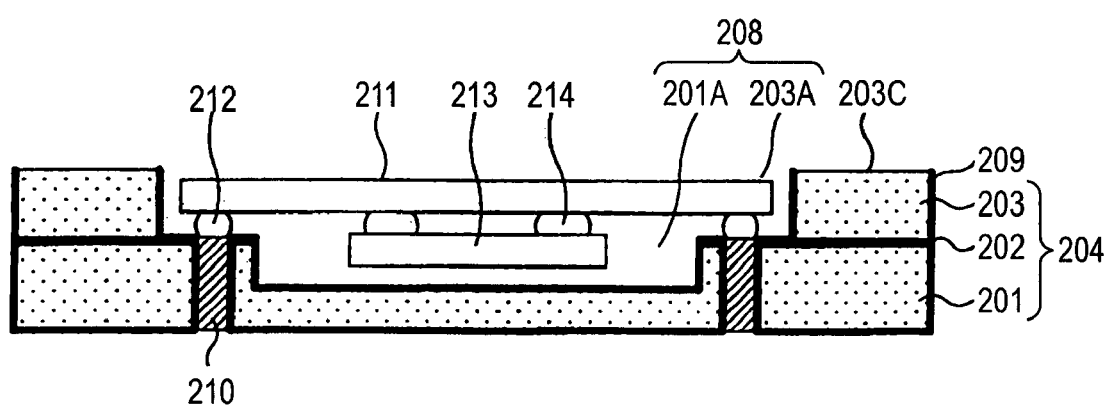
FIG. 2H is an (eighth) view illustrating the method of manufacturing a semiconductor device in accordance with Embodiment 2.
Figure 2I:
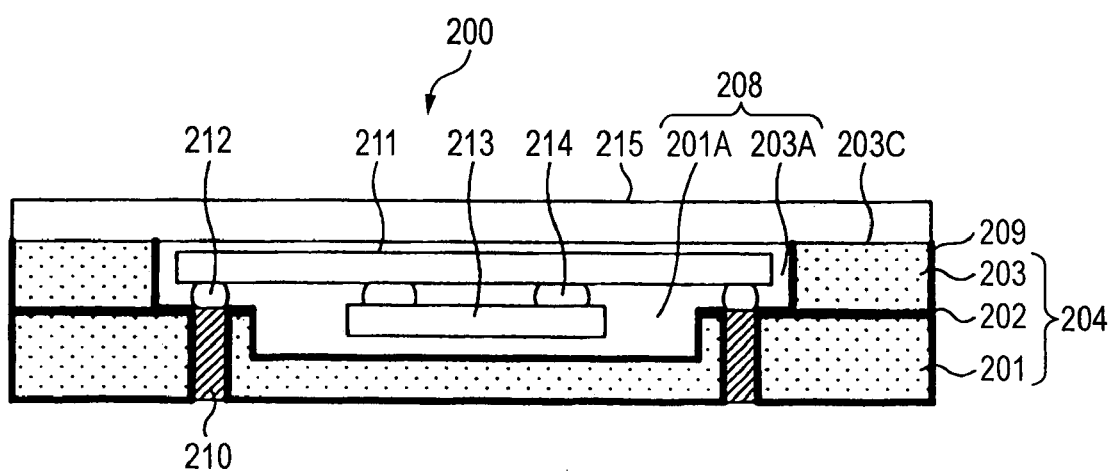
FIG. 2I is a (ninth) view illustrating the method of manufacturing a semiconductor device in accordance with Embodiment 2.

FIGS. 2A to 2I illustrate a method of manufacturing a semiconductor device in a procedure in accordance with Embodiment 2 of the invention, and FIG. 2I also illustrates a structure of the semiconductor device in accordance with Embodiment 2 of the invention. Only, the same parts as previously described are indicated by the same reference numerals in the following drawings and a description is omitted.

First, in a process as illustrated in FIG. 2A like the process as illustrated in FIG. 1A of Embodiment 1, a laminated substrate 204 is formed. In this case, for example, the laminated substrate 204 can be formed by laminating a first semiconductor substrate 201 made of a silicon substrate (or silicon wafer) and a second semiconductor substrate 203 made of a silicon substrate (or silicon wafer). A junction layer 202 made of, for example, a silicon oxide film can be formed between the first semiconductor substrate 201 and the second semiconductor substrate 203 (or to the junction surface) to stably join the substrates. Further, the junction layer 202 can be used as a stopper layer in etching as described below.

Further, in this embodiment, the second semiconductor substrate 203 can be formed which is thicker than the first semiconductor substrate 201 through a pre-polishing process.

Next, in a process as illustrated in FIG. 2B, a resist pattern 205 having an opening 205A is formed on the laminated substrate 204 (or the second semiconductor substrate 203), for example, using a patterning method based on a photolithography method.

Next, in a process as illustrated in FIG. 2C, a pattern etching of the second semiconductor substrate 203 is performed with the resist pattern 205 serving as a mask through a dry etching and a hole 203A passing through the second semiconductor substrate 203 is formed. The pattern etching can be performed through a wet etching.

Since the junction layer 202 having a constitution different from that of the second semiconductor substrate 203 functions as an etching stopper layer in etching as described above, etching is stopped at a point of time when the junction layer 202 is exposed.

Next, in a process as illustrated in FIG. 2D, the junction layer 202 exposed at a lower part of the hole 203A is etched and removed by changing a type of gas to be used in the dry etching (or changing etching liquid to be used in the wet etching). In addition, a resist pattern 206 having an opening 206A to be used in etching as illustrated in FIG. 2E is formed on the newly laminated substrate 204 (or the second semiconductor substrate 203). In this case, when an opening area of the opening 206A is larger than that of the hole 203A, a concave part having a step shape can be formed as described below.

A resist pattern 207 having an opening 207A to be used in etching as illustrated in FIG. 2F is formed in the first semiconductor substrate 201.

Next, in a process as illustrated in FIG. 2E, a pattern etching of the second semiconductor substrate 203 is performed with the resist pattern 206 serving as a mask through the dry etching. Since the junction layer 202 functions as an etching stopper layer in a process of etching the second semiconductor substrate 203, the process of etching the second semiconductor substrate 203 is stopped at a point of time when the junction layer 202 is exposed. Herein, the opening area of the hole 203A passing through the second semiconductor substrate 203 increases which corresponds to the opening 206A.

In the process of etching the semiconductor substrate 203, a pattern etching of the first semiconductor substrate 201 exposed is performed. In this case, the first semiconductor substrate 201 is also etched with etching of the second semiconductor substrate 203 and a hole 201A is formed in the first semiconductor substrate. It is desirable to form the hole 201A such that the hole 201A does not pass through the first semiconductor substrate 201. For this reason, it is desirable to construct in advance the first semiconductor substrate 201 thicker than the second semiconductor substrate 203.

As a result of etching as described above, a concave part 208 is formed in which the hole 203A passing through the second semiconductor substrate 203 communicates with the hole 201A formed in the first semiconductor substrate 201. In this embodiment as described above, the concave part 208 can be deeply formed since the concave part 208 is formed over a plurality of semiconductor substrates to be laminated.

Further, the concave part 208 is formed in which the opening area of the hole 203A is large in the second semiconductor substrate 203 serving as the upper layer and the opening area of the hole 201A is small in the first semiconductor substrate 201 serving as the lower layer.

Next, in a process as illustrated in FIG. 2F (whose top and bottom are reversed from the previous drawing), a pattern etching of the first semiconductor substrate 201 is performed with a resist pattern 207 serving as a mask through the dry etching and a hole (or via hole) 201B passing through the first semiconductor substrate 201 is formed. In addition, the junction layer 202 exposed at a lower part of the hole 201B is etched and removed by changing a type of gas to be used in etching.

Next, in a process as illustrated in FIG. 2G, an insulating film (for example, a thermal oxide film) 209 is formed on a surface of the laminated substrate 204 (or the first semiconductor substrate 201 and the second semiconductor substrate 203). Further, it is desirable to exfoliate an insulating film of a junction surface 203C with which a cover for sealing the semiconductor element is joined in a subsequent process.

Next, a via plug 210 made of a conductivity material (for example, Cu) is formed in the via hole 201B by, for example, a plating method.

Next, in a process as illustrated in FIG. 2H, a semiconductor element 211 on which a bump 212 is formed is mounted in the concave part 208. In this case, the semiconductor element 211 is flip-chip connected and mounted in the via plug 210 formed to pass through the laminated substrate 204 (or the first semiconductor substrate 201) at a lower part of the concave part 208. A semiconductor element 213 different from the semiconductor element 211 is connected via a bump 214 on a surface on which the bump 212 is formed.

In the semiconductor device in accordance with this embodiment, the plurality of semiconductor elements 211 and 213 can be laminated and mounted since the concave part 208 is deeply formed over the plurality of semiconductor substrates.

Preferably, if the semiconductor element 213 is an MEMS element, the semiconductor device can be miniaturized when the semiconductor element 211 including a driver of the MEMS element is laminated and mounted with the MEMS element.

As in the case of Embodiment 1, the semiconductor elements 211 and 213 can be sealed in the concave part 208 by performing the next process of FIG. 2I.

For example, in the process as illustrated in FIG. 2I, a flat-shaped cover 215 is installed on the concave part 208 to seal the semiconductor elements 211 and 213. In this case, the cover 215 is joined with the laminated substrate 204 (or the second semiconductor substrate 203). Further, when the cover 215 is made of glass, the cover 215 is connected to the junction surface 203C of the second semiconductor substrate 203 made of silicon through an anodic bonding process. Therefore, the concave part 208 is of the closed space and the semiconductor elements 211 and 213 are sealed in the closed space.

Therefore, a semiconductor device 200 can be manufactured in which the semiconductor elements 211 and 213 are laminated and mounted in the concave part 208 of the laminated substrate 204.

The method of manufacturing a semiconductor device is characterized in that the concave part 208 for mounting the semiconductor element can be deeply formed since the concave part 208 is formed over the semiconductor substrates 201 and 203. For example, the concave part 208 is constructed such that the hole 203A passing through the second semiconductor substrate 203 communicates with the hole 201A formed in the first semiconductor substrate 201.

Therefore, various types of semiconductor elements can be mounted (or sealed) in the semiconductor device 200. For example, an MEMS element and a semiconductor element including its driver can be laminated (or sealed).

Further, in the embodiment as described above, the laminated substrate can be constructed such that crystal orientations of semiconductor substrates constructing the laminated substrate are different from each other. For example, in the case of Embodiment 2, the first semiconductor substrate 201 and the second semiconductor substrate 203 can be laminated to form the laminated substrate 204 such that crystal orientations of the first semiconductor substrate 201 and the second semiconductor substrate 203 are different from each other.

Figure 3A:
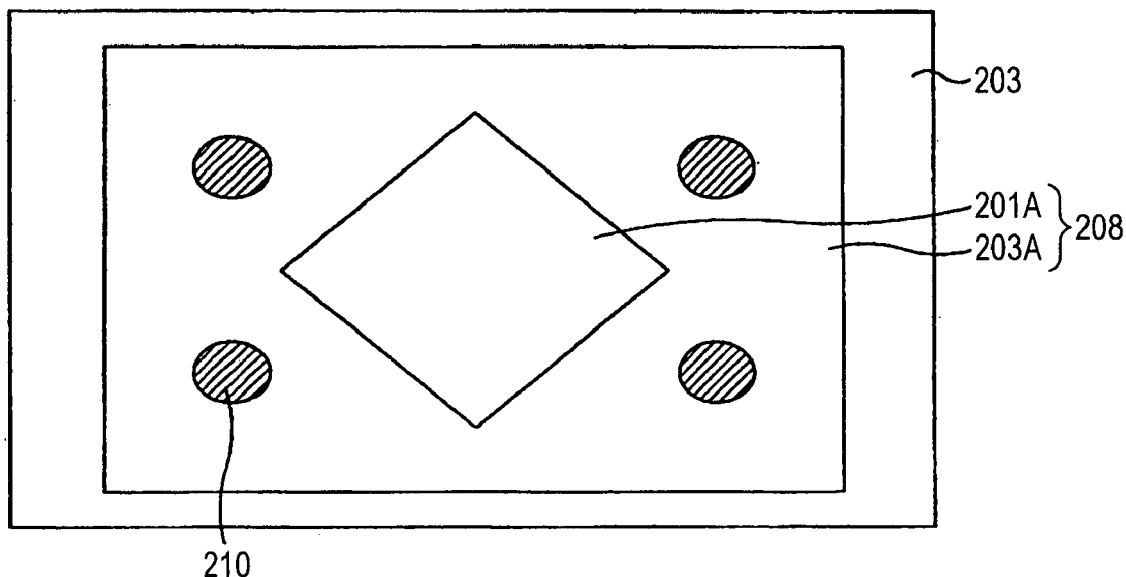
FIG. 3A is a (first) view illustrating a modified example of Embodiment 2.

FIG. 3A is a plane view illustrating a state corresponding to FIG. 2 of Embodiment 1 as described above. Only, the same parts as previously described are indicated by the same reference numerals in the following drawings and a description is omitted. Further, in this drawing, a first semiconductor substrate 201 and a second semiconductor substrate 203 are laminated such that crystal orientations of the first semiconductor substrate 201 and the second semiconductor substrate 203 are different from each other by 45 degree. In this case, as illustrated in this drawing, a hole 203A and a hole 201A can be formed in different directions.

Figure 3B:
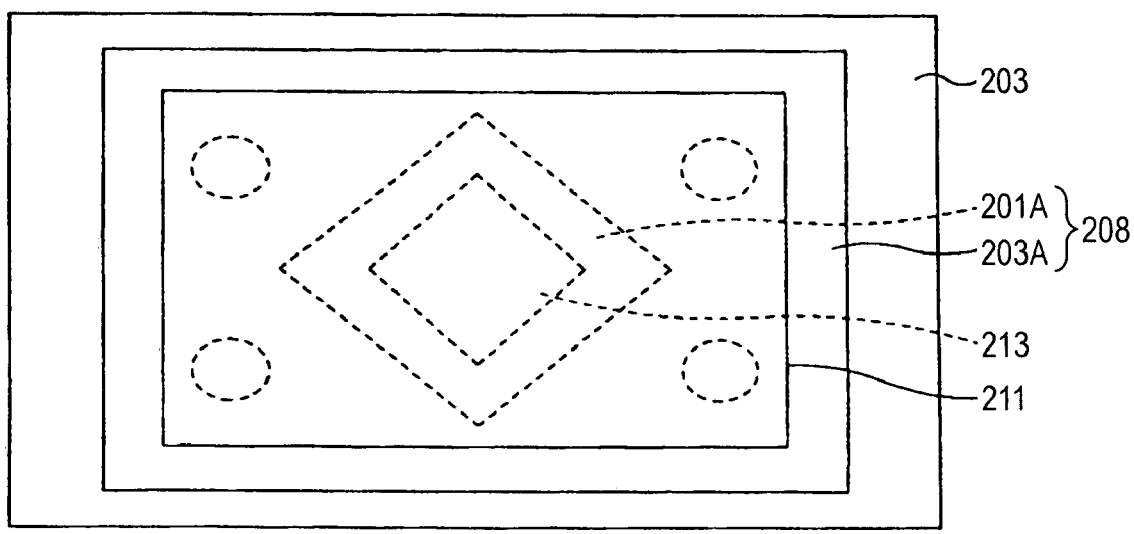
FIG. 3B is a (second) view illustrating the modified example of Embodiment 2.

Further, FIG. 3B is a plane view illustrating a process subsequent to that of FIG. 3A (or a state corresponding to FIG. 2H of Embodiment 2). In this drawing, a semiconductor element 213 can be mounted to be slant with respect to a semiconductor element 211.

That is, a direction of mounting of a semiconductor element can be variously changed by forming a laminated substrate such that crystal orientations of a plurality of substrates to be laminated are different from each other, and a semiconductor element can be mounted in a reduced space by improving the degree of freedom of a design of a semiconductor device.

Further, when a semiconductor substrate is etched as described above, both a dry etching using a mask and a wet etching using etching liquid can be used.

Figure 4:
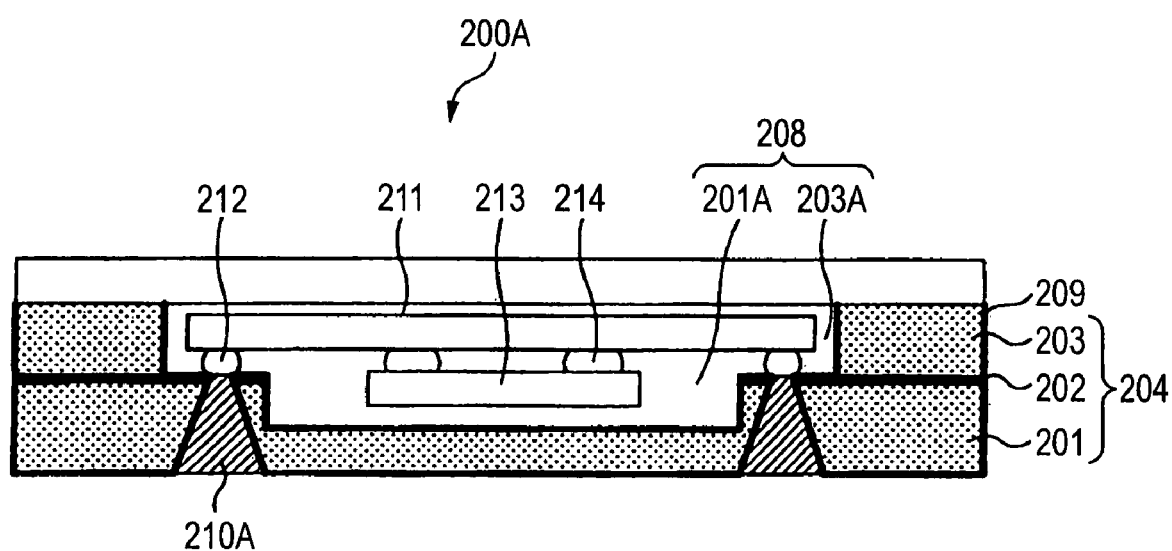
FIG. 4 is a view illustrating another modified example of Embodiment 2.

FIG. 4 is an example in which a via plug is formed through an anisotropic etching and a semiconductor device 200A corresponding to the semiconductor device 200 is manufactured in the process of FIG. 2F in Embodiment 2 as described above. Only, the same parts as previously described are indicated by the same reference numerals in the following drawings and a description is omitted.

As illustrated in FIG. 4, a via plug 210A corresponding to the via plug 210 as illustrated in FIG. 2I is formed in a taper shape. Therefore, an etching method or an etching pattern can be variously modified or changed, if needed.

Semiconductor elements sealed in the semiconductor devices 100 and 200 are, for example, an acceleration sensor, a temperature sensor, a micro mirror device, an optical device such as a light receiving device and a light emitting device, and the like. Further, the invention is not limited to these semiconductor elements, but other various semiconductor elements can be mounted.

An example of a silicon substrate as a semiconductor substrate for constructing a laminated substrate has been described in the embodiment. The invention is not limited to the silicon substrate, and for example, a SiGe substrate or a compound semiconductor substrate and the like can be used.

The invention can provide a semiconductor device in which the productivity is better and a semiconductor element is mounted in a substrate and a method of manufacturing the semiconductor device.

What is claimed is:

1. A semiconductor device, comprising:
   a laminated substrate formed by laminating a plurality of semiconductor substrates made of silicon and being laminated by a junction layer formed of a silicon oxide film, the laminated substrate being provided with a concave part formed therein, and
   a semiconductor element mounted in the concave part.

2. The semiconductor device according to claim 1, wherein
   a via plug passing through the laminated substrate is formed in a lower surface of the concave part, and
   the semiconductor element is mounted to be connected to the via plug.

3. The semiconductor device according to claim 1, wherein the concave part is formed to pass through at least one of the plurality of semiconductor substrates.

4. The semiconductor device according to claim 1, wherein the concave part has a structure in which holes respectively formed in the plurality of semiconductor substrates communicate.

5. The semiconductor device according to claim 1, wherein the via plug is formed in a taper shape.

6. The semiconductor device according to claim 1, wherein the semiconductor element is an acceleration sensor.

7. The semiconductor device according to claim 1, wherein the semiconductor element is an optical device.

8. A semiconductor device, comprising:
   a laminated substrate formed by laminating a plurality of semiconductor substrates, the laminated substrate being provided with a concave part formed therein; and
   a semiconductor element mounted in the concave part, wherein
   the plurality of semiconductor substrates are laminated in which crystal orientations of the plurality of substrates are different to construct the laminated substrate.

9. A semiconductor device, comprising:
   a laminated substrate formed by laminating a plurality of semiconductor substrates, the laminated substrate being provided with a concave part formed therein; and
   a semiconductor element mounted in the concave part, wherein
   the semiconductor substrates are laminated such that crystal orientations thereof are different from each other by 45 degrees.

* * * * *